(12) United States Patent
Chen et al.

(10) Patent No.: US 9,960,323 B2
(45) Date of Patent: May 1, 2018

(54) LED MODULE AND ITS MANUFACTURING PROCESS

(71) Applicant: HANGZHOU HPWINNER OPTO CORPORATION, Hangzhou, Zhejiang (CN)

(72) Inventors: Kai Chen, Zhejiang (CN); Jianming Huang, Zhejiang (CN)

(73) Assignee: Hangzhou Hpwinner Opto Corporation, Hangzhou, Zhejiang Province (CN)

( * ) Notice: Subject to any disclaimer, the term of this patent is extended or adjusted under 35 U.S.C. 154(b) by 277 days.

(21) Appl. No.: 14/893,432

(22) PCT Filed: Jun. 17, 2013

(86) PCT No.: PCT/CN2013/077333
§ 371 (c)(1),
(2) Date: Nov. 23, 2015

(87) PCT Pub. No.: WO2014/186994
PCT Pub. Date: Nov. 27, 2014

(65) Prior Publication Data
US 2016/0126427 A1    May 5, 2016

(30) Foreign Application Priority Data

May 21, 2013  (CN) .......................... 2013 1 0193583
May 21, 2013  (CN) ...................... 2013 2 0284482 U (51) Int. Cl.
*H01L 33/48*    (2010.01)
*H01L 33/64*    (2010.01)
(Continued)

(52) U.S. Cl.
CPC .............. *H01L 33/486* (2013.01); *F21K 9/00* (2013.01); *F21K 9/90* (2013.01); *F21V 29/74* (2015.01);
(Continued)

(58) Field of Classification Search
CPC ... H01L 33/486; H01L 33/507; H01L 33/647; H01L 33/56; H01L 33/58; F21K 9/00; F21K 9/90; F21V 29/74
See application file for complete search history.

(56) References Cited

U.S. PATENT DOCUMENTS

| | | | |
|---|---|---|---|
| 2004/0001344 A1* | 1/2004 | Hecht | F21V 7/005 362/555 |
| 2009/0237936 A1* | 9/2009 | Ku | F21S 2/005 362/249.14 |

FOREIGN PATENT DOCUMENTS

| | | |
|---|---|---|
| CN | 101980387 A | 2/2011 |
| CN | 202487569 U | 10/2012 |

(Continued)

*Primary Examiner* — David V Bruce
(74) *Attorney, Agent, or Firm* — Muncy, Geissler, Olds & Lowe, P.C.

(57) ABSTRACT

A LED module includes a lens group, an LED illuminant, a circuit board and a heat sink; the LED illuminant includes an LED chip and a heat sink holder; the LED chip is attached to the heat sink holder which is disposed on the circuit board by Surface Mounted Technology; the lens group covers the heat sink, and is located above the LED chip; encapsulant is filled in a confined space formed between the lens group and the heat sink through a process of injection. Compared with the prior art, in the LED module of the present invention, the encapsulant replaces the original air medium in the transmission process of the light emitted by the LED chip; moreover, matching between the refractive index of the encapsulant and the lens of the lens group improves the light (Continued)

out-coupling efficiency. Lighting efficiency is improved by 10~15% compared with the prior art.

16 Claims, 5 Drawing Sheets

(51) Int. Cl.
    *F21K 9/00*         (2016.01)
    *F21K 9/90*         (2016.01)
    *F21V 29/74*       (2015.01)
    *H01L 33/50*       (2010.01)
    *H01L 33/58*       (2010.01)
    *H01L 33/56*       (2010.01)

(52) U.S. Cl.
    CPC .......... *H01L 33/507* (2013.01); *H01L 33/647* (2013.01); *H01L 33/56* (2013.01); *H01L 33/58* (2013.01)

(56) References Cited

FOREIGN PATENT DOCUMENTS

| | | | |
|---|---|---|---|
| CN | 202736976 U | * | 2/2013 |
| CN | 103094425 A | | 5/2013 |
| EP | 2043166 A1 | | 4/2009 |
| JP | 2011-210787 A | | 10/2011 |
| KR | 10-2010-0035962 A | | 4/2010 |

* cited by examiner

LED MODULE AND ITS MANUFACTURING PROCESS

TECHNICAL FIELD

The present invention relates to the technical field of illuminating lamp, especially to an LED module and its manufacturing process.

BACKGROUND

With the development of LED chip technology and encapsulation technology, more and more LED products have been applied to lighting field, especially white light LED of high power. Due to its high light efficiency, long service life, energy conservation and environment protection, proper light regulation and absence of polluting substances including mercury, LED lights have become the new lighting source after traditional incandescent light bulbs and fluorescent lamps.

However, current LED modules existing the following disadvantages:
1. the light emitted from the LED chip of the existing LED modules should pass air medium, which will cause interface loss, resulting in low luminous efficiency of LED chip;
2. once any moisture has entered, the LED illuminant will be damaged because of the absence of fillers between the lens group and heat sink in the existing LED modules;
3. the LED illuminants of the existing LED modules transmit the heat to the circuit board only through the bottom of the heat sink holder, that renders poorer radiation efficiency.

SUMMARY

The present invention provides an LED module to resolve the technical problem of the existing LED modules that light emitted from LED chip of the existing LED modules needs to pass air medium, which will cause interface loss and thereafter results in low luminous efficiency of LED chip.

The present invention provides also a manufacturing process of the above-mentioned LED module to resolve the technical problem of the existing LED modules that light emitted from LED chip of the existing LED modules needs to pass air medium, which will cause interface loss and thereafter results in low luminous efficiency of LED chip.

The objectives of the present invention are realized through the following technical solution:

An LED module, includes a lens group, a seal ring, an LED illuminant, a circuit board and a heat sink; the LED illuminant includes an LED chip and a heat sink holder; the LED chip is attached to the heat sink holder which is set on the circuit board; the lens group cover the heat sink, and is located above the LED chip; The heat sink is configured with a via hole that is sealed by sealant; encapsulant is filled in a confined space formed among the lens group, the seal ring, the sealant and the heat sink through the process of injection.

Preferably, the encapsulant is transparent with refractive index of 1.4~3, which is slightly higher than the one of the lens of the lens group and slightly lower than the one of the LED chip.

Preferably, the infusion hole and the discharging hole are set at the bottom of the heat sink; through-holes corresponding to the infusion hole and the discharging hole are set on the circuit board.

Preferably, the LED chip is fixed on the heat sink holder through die bonding and fluorescent powders are set on the LED chip.

Preferably, the heat sink holder is made of high conductive insulation materials.

Preferably, the high conductive insulation materials include high conductive ceramic materials such as AlN.

Preferably, the LED illuminant includes silica cap which is set on the heat sink holder and above the LED chip.

Preferably, the LED chip is fixed on the heat sink holder through die bonding; encapsulant mixed with fluorescent powder is set on the LED chip.

Preferably, the heat sink holder is made with metal materials and resin materials wherein the metal materials function as heat sink and conductive bonding pad, and the resin materials function as a reflector and also for fixing the encapsulant and preventing any leakages of encapsulant when it has not been solidified.

Preferably, several reinforcing ribs are set on the upper surface of the lens group.

Preferably, several channels are set on the internal surface of the lens group to facilitate infusion of encapsulant.

A manufacturing process of an LED module includes the following steps:
(1) attaching the LED chip on the heat sink holder which is set on the circuit board by Surface Mounted Technology;
(2) attaching the circuit board with the heat sink tightly, setting a seal ring around the heat sink, placing the lens group over the heat sink and the lens group is located above the LED chip;
(3) injecting encapsulant to a space between the heat sink and the lens group through a infusion hole at the bottom of the heat sink and making the space be full of the encapsulant, and the extra air is discharged through a discharging hole;
(4) sealing the infusion hole and the discharging hole by tightening screw and/or with glue sealing.

Preferably, the step (3) also includes: injecting encapsulant into the channels on the internal surface of the lens group through the infusion hole at the bottom of the heat sink.

Preferably, the encapsulant is transparent with refractive index of 1.4~3.

An LED module includes LED illuminant and aluminum substrate; the LED illuminant includes an LED chip and a radiation base; the LED chip is attached to the radiation base which is set on the aluminum substrate by Surface Mounted Technology.

Preferably, the LED module also includes a lens group and a heat sink; the aluminum substrate is attached to the radiation base and the lens group is set over the heat sink; a space formed between the lens group and the heat sink is filled with encapsulant with refractive index of 1.4~3.

Compared with the prior art, the present invention has the following advantages:
1. Compared with the prior art, in the LED module of the present invention, the original air medium is replaced by encapsulant during the transmission of the light emitted from the LED chip. Moreover, the matching of the refractive index of the encapsulant and the lens of the lens group improves light out-coupling efficiency to the greatest extent. Lighting efficiency is improved by 10~15% compared with the prior art.
2. In the LED module of the present invention, the confined space formed between the lens group and the heat sink is filled with encapsulant. The circuit board and each LED illuminant are covered by the encapsulant, rendering good water-proof performance.

3. Heat generated from the LED illuminants of the present invention will not only be transmitted to the circuit board through the bottom of the heat sink holder, but also can transmitted to the external environment through the encapsulant, which renders higher radiation efficiency.

DESCRIPTION OF THE PREFERRED EMBODIMENTS

Hereinafter the invention will be described in detail referring to the attached drawings.

Embodiment 1

With reference to FIG. 1-10, the LED module of the present invention, includes a lens group 1, a seal ring 4, an LED illuminant 21, a circuit board 2 and a heat sink 3. The lens group is equipped with several buckle structures 13, the seal ring 4 may includes a solid seal ring and liquid seal ring or either of the two; via holes 24, 33 are set on the circuit board and the heat sink, and the via holes are sealed with sealant; the LED illuminant 21 includes a LED chip 211 and a heat sink holder 212; the LED chip is attached to the heat sink holder which is pasted on the circuit board 2 through Surface Mounted Technology. The lens group 1 is set over the heat sink 3 through the buckle structure and is located above the LED chip. A confined space formed among the lens group 1, the seal ring 4, the heat sink 3 and the sealant in the via holes is filled with encapsulant by injection technology. The above structure of the LED module is only an example, not limiting the invention. Other structures may also be adopted for the LED module.

The confined space formed among the lens group 1, the seal ring 4, the heat sink 3 and sealant in via hole is filled with encapsulant by injection technology. Thus, when the encapsulant is filled in through the infusion hole, air will be discharged through the discharging hole, therefore completely discharging air out from the confined space, and preventing any bubbles remained in the encapsulant.

In present embodiment, the encapsulant selected is transparent with refractive index slightly higher than the one of the lens of the lens group, and preferably that the refractive index of the encapsulant is slightly higher than the one of the lens of the lens group and is slightly lower than the one of the LED chip. Refractive index of the LED chip is about 1.7~4 and the one of the lens of the lens group is about 1.4~1.6. The refractive index of the encapsulant should be fall in between the two, and thus 1.4~3 is adopted.

In this way, the huge difference of the refractive indexes leads to total reflection, which reflects the light back to the interior of the chip and can not export effectively, which results in low luminous efficiency. Therefore, improving the refractive index of the packaging materials to be fall in between the refractive indexes of the LED chip and lens reduces occurrence of total refection and thus improving luminous efficiency of the LED chip.

In the LED module of the present invention, encapsulant replaces the original air medium in the transmission of light that emitted from the LED chip; moreover, the refractive index of the encapsulant is matched with that of the lens of the lens group, which improves light out-coupling efficiency to the greatest extent. In present embodiment, the refractive index of the selected encapsulant is 1.4~3. Based on the experimental data, the lighting efficiency is improved by 10~15% compared with the prior art.

Figure 1:
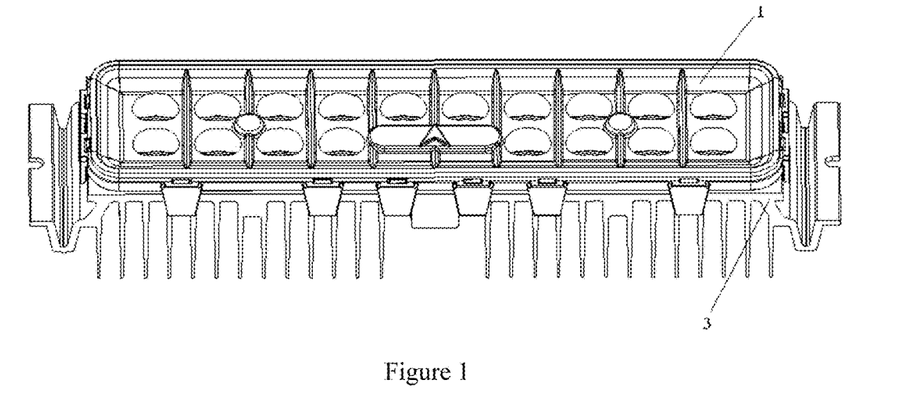
FIG. 1 is a structure diagram of the LED module of the present invention.
Figure 2:
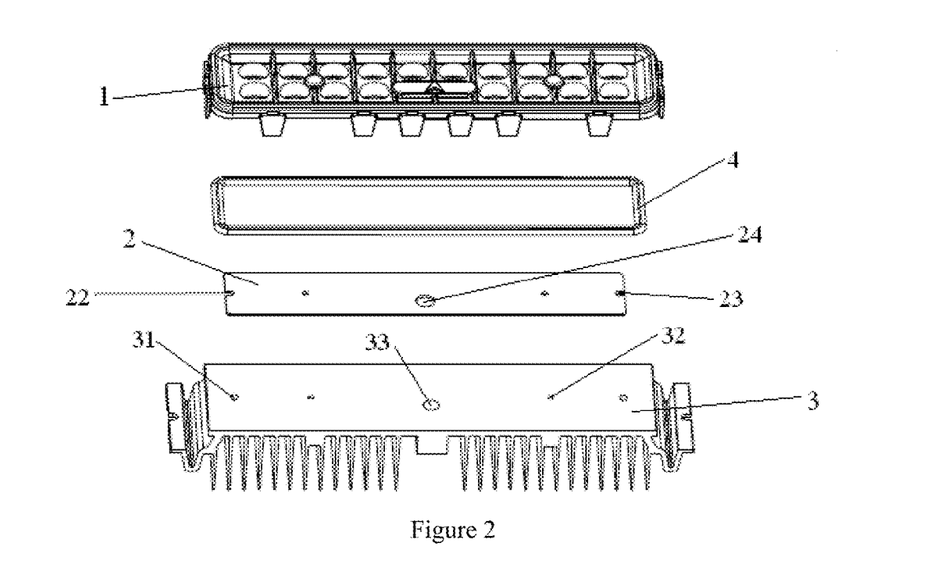
FIG. 2 is a decomposition diagram of the LED module of the present invention.
Figure 3:
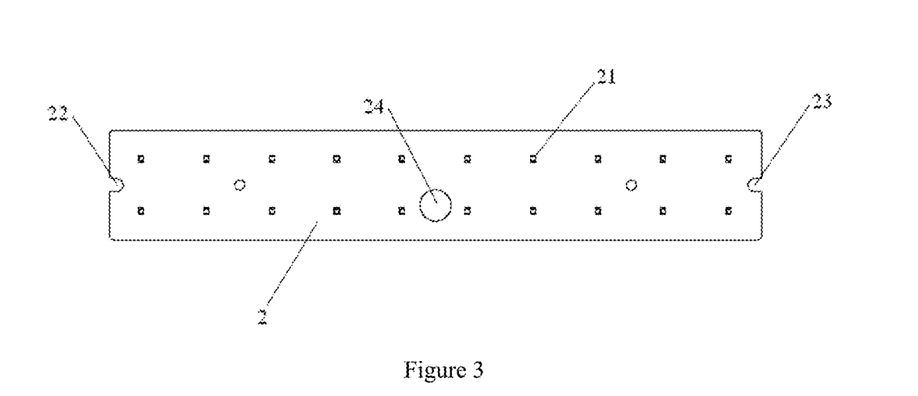
FIG. 3 is a structure diagram of the circuit board of the present invention.
Figure 4:
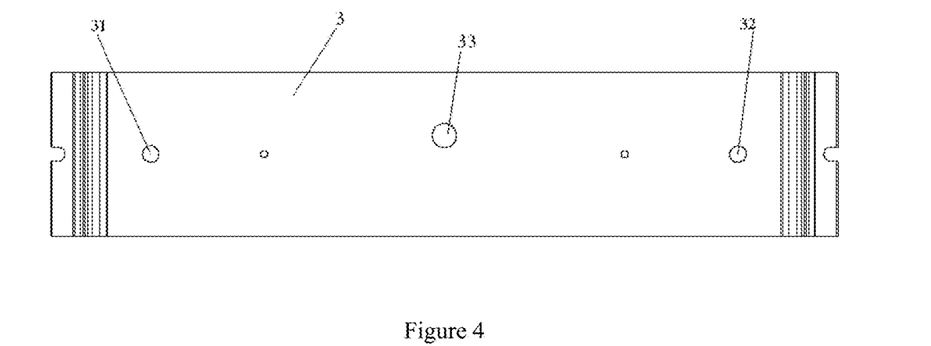
FIG. 4 is a structure diagram of the heat sink of the present invention.

With reference to FIG. 2-4, in present embodiment, a infusion hole 31, a discharging hole 32 and the via hole 33 are set at the bottom of the heat sink 3; through-holes 22, 23 corresponding to the infusion hole 31, the discharge hole 32 and the line hole 24 are set up on the circuit board 2. The number of the infusion hole can be one or more, so is it for the discharging hole; forms of the infusion holes and discharge holes are not limited. In present embodiment, one infusion hole 31 and one discharge hole 32 is respectively set at the bottom of the heat sink 3. When the heat sink 3 and the lens group are buckled-connected, encapsulant is filled into the space formed among the heat sink, the seal ring, the lens group and sealing structure of the via hole through the infusion hole at the bottom of the heat sink, and the extra air is discharged through the discharging hole to ensure the sealing to the greatest extent.

Figure 5:
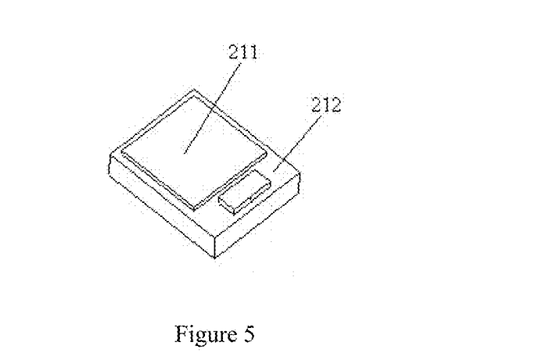
FIGS. 5 and 6 are structure diagrams of one embodiment of the LED illuminant of the present invention.
Figure 6:
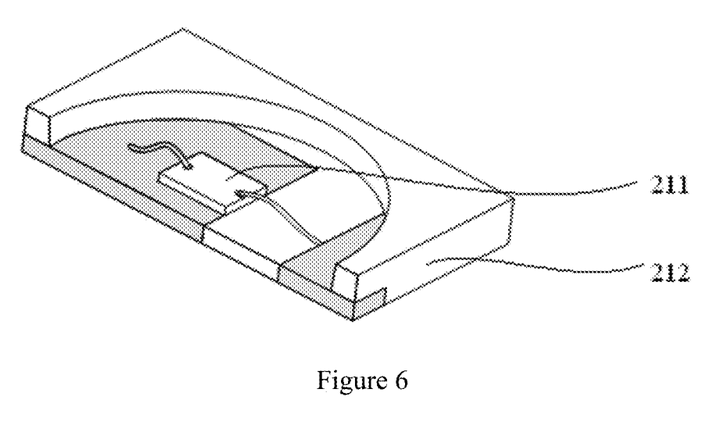

With reference to FIGS. 5 and 6, in the Embodiment, the LED chip is fixed on the heat sink holder through die bonding and fluorescent powders are set on the LED chip. The heat sink holder is made of high conductive insulation materials. Preferably, high conductive ceramic materials AlN have been adopted for ensuring the radiation to the greatest extent.

Figure 7:
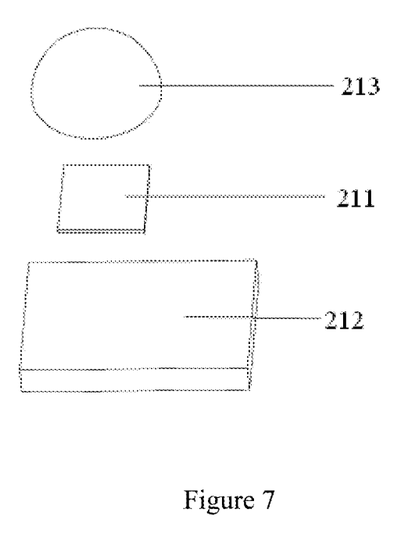
FIG. 7 is a structure diagram of another embodiment of the LED illuminant of the present invention.

With reference to FIG. 7, in the Embodiment, the LED illuminant includes silica cap 213 which is set on the heat sink holder 212 and above the LED chip 211.

Figure 8:
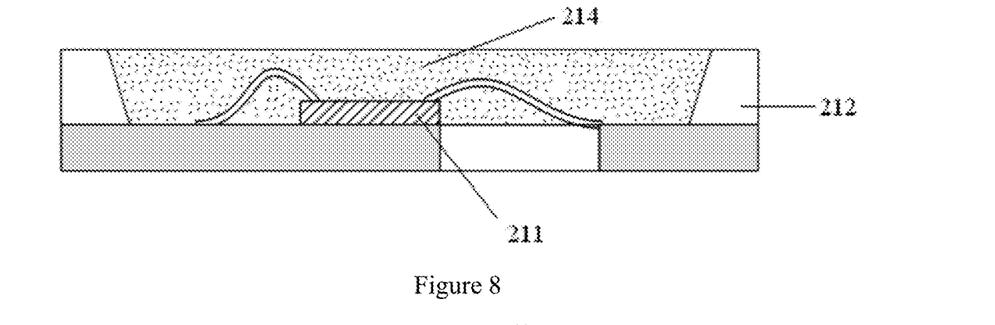
FIG. 8 is a structure diagram of a further embodiment of the LED illuminant of the present invention.

With reference to FIG. 8, in the Embodiment, the LED chip 211 are fixed on the heat sink holder 212 by die bonding and encapsulant 214 mixed with fluorescent powder are also provided at the LED chip. Wherein, the heat sink holder 212 is made with the mixture of metal materials and resin materials, wherein the metal materials have the function of being heat sink and conductive bonding pad, and the resin materials have the function of being as a reflector and also fixing the encapsulant, which is preventing any leakages of encapsulant when it has not been solidified.

Figure 9:
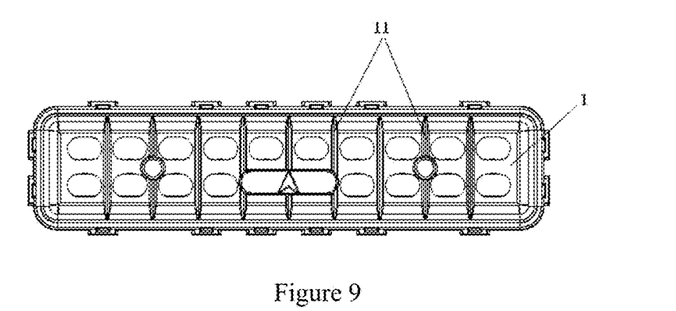
FIG. 9 is a structure diagram of the external side of the lens group of the present invention.
Figure 10:
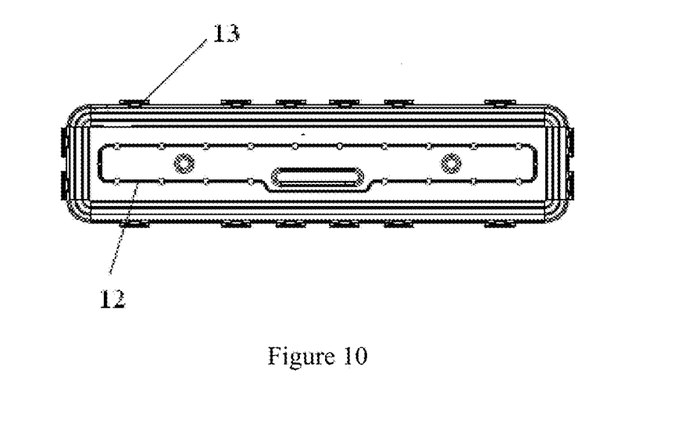
FIG. 10 is a structure diagram of the internal side of the lens group of the present invention.

With reference to FIGS. 9 and 10, in the Embodiment, several reinforcing ribs 11 which can enhance the soundness of the lens group are equipped on the upper surface of the lens group 1; several channels 12 are equipped on the internal surface of the lens group to facilitate infusion of encapsulant.

The invention also provides the manufacturing process of an LED module; the process includes the following steps:
(1) fit an LED chip on the heat sink holder, and paste the heat sink holder on the circuit board through Surface Mounted Technology;
(2) tightly fit the circuit board and the heat sink, and a seal ring is set around periphery of the heat sink, and cover the lens group on the heat sink, and the lens group is located above the LED chip;
(3) infuse encapsulant through the infusion hole at the bottom of the heat sink to the space between the heat sink and the lens group until full, and the extra air is discharged through the discharge hole;
(4) seal the infusion holes and discharging holes by tightening screw and/or with glue sealing.

To facilitate the infusion of the encapsulant, the step (3) also includes: infuse the encapsulant through the infusion holes at the bottom of the heat sink into the channels on the internal surface of the lens group and then into the space between the heat sink and the lens group, wherein the encapsulant are transparent with refractive index of 1.4~3.

Embodiment 2

Figure 11:
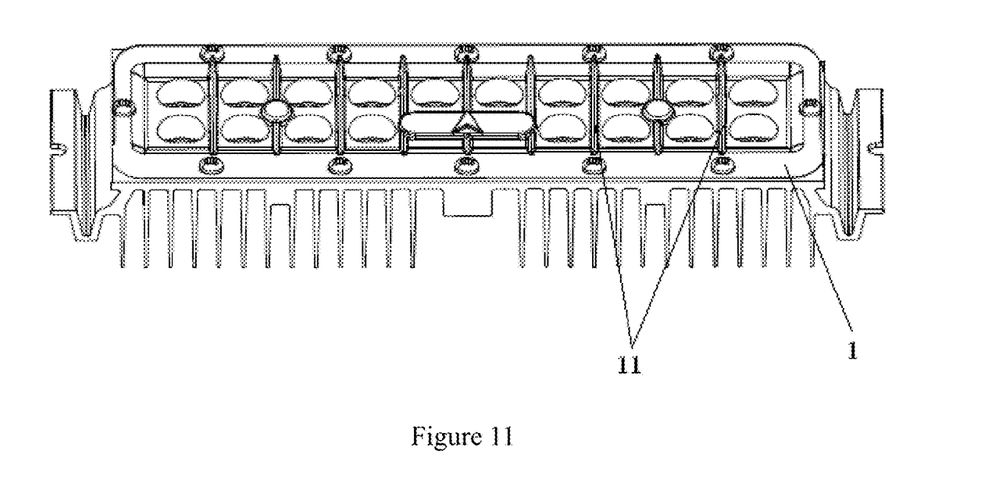
FIG. 11 is a structure diagram of another embodiment of the LED module of the present invention.

With reference to FIG. 11, the Embodiment varies from the former Embodiment in that the lens group and heat sink of the Embodiment are not buckled but tightened with screws.

In the LED module of the present invention, the confined space formed between the lens group and the heat sink is filled with encapsulant, so that the circuit board and each LED illuminant are covered by the encapsulant, rendering good water-proof performance; in the LED module of the present invention, heat generated from the LED illuminants of the present invention can not only be transmitted to the circuit board through the bottom of the heat sink holder, but also can be transmitted to the circumstance through the encapsulant, rendering higher radiation efficiency.

The details disclosed above are only some embodiments of the application. However, the application should not be limited to the above description. Any alteration the technicians of the field may come up with should be within the scope of protection of the application.

The invention claimed is:
1. An LED module, comprising:
a lens group;
a seal ring;
an LED illuminant; a circuit board and
a heat sink,
wherein the LED illuminant includes an LED chip and a heat sink holder,
wherein the LED chip is attached to the heat sink holder which is set on the circuit board by Surface Mounted Technology,
wherein the lens group covers the heat sink, and is located above the LED chip,
wherein the heat sink is configured with a via hole that is sealed by sealant,
wherein encapsulant is filled in a confined space formed among the lens group, the seal ring, the sealant and the heat sink through a process of injection,
wherein encapsulant mixed with fluorescent powder is set on the LED chip, and
wherein the encapsulant is transparent and has a refractive index slightly higher than a refractive index of a lens of the lens group and is slightly lower than a refractive index of the LED chip.

2. The LED module of claim 1, wherein the refractive index of the selected encapsulant is 1.4~3.

3. The LED module of claim 1, wherein a infusion hole and a discharging hole are set at the bottom of the heat sink, and
wherein through-holes corresponding to the infusion hole and the discharging hole are set on the circuit board.

4. The LED module of claim 1, wherein the LED chip is fixed on the heat sink holder through die bonding.

5. The LED module of claim 4, wherein the heat sink holder is made of high conductive insulation materials.

6. The LED module of claim 5, wherein the high conductive insulation materials include high conductive ceramic materials.

7. The LED module of claim 1, wherein the LED illuminant also includes silica cap which is set on the heat sink holder and above the LED chip.

8. The LED module of claim 1, wherein the LED chip is fixed on the heat sink holder through die bonding.

9. The LED module of claim 8, wherein the heat sink holder is made of the mixture of metal materials and resin materials.

10. The LED module of claim 1, wherein several reinforcing ribs are set on the upper surface of the lens group.

11. The LED module of claim 1, wherein several channels are set on the internal surface of the lens group to facilitate injection of encapsulant.

12. A manufacturing process of an LED module, the process comprising:
attaching an LED chip on a heat sink holder which is set on a circuit board by Surface Mounted Technology;
tightly attaching the circuit board with a heat sink, and setting on a seal ring around the heat sink, then placing a lens group cover the heat sink and the lens group is located above the LED chip;
injecting encapsulant to a space between the heat sink and the lens group through a infusion hole at the bottom of the heat sink and making the space be full of encapsulant, and the extra air is discharged through a discharging hole; and
sealing the infusion hole and the discharging hole by tightening screw and/or with glue sealing,
wherein encapsulant mixed with fluorescent powder is set on the LED chip, and
wherein the encapsulant is transparent and has a refractive index slightly higher than a refractive index of a lens of the lens group and is slightly lower than a refractive index of the LED chip.

13. The manufacturing process of the LED module of claim 12, wherein, said injecting also includes injecting encapsulant into channels on the internal surface of the lens group through the infusion hole at the bottom of the heat sink.

14. The manufacturing process of the LED module of claim 12, wherein, the encapsulant is transparent with refractive index of 1.4~3.

15. An LED module, comprising:
an LED illuminant; and
an aluminum substrate,
wherein the LED illuminant includes an LED chip and a radiation base, and
wherein the LED chip is attached to the radiation base which is set on the aluminum substrate by Surface Mounted Technology,
wherein encapsulant mixed with fluorescent powder is set on the LED chip, and wherein the encapsulant is transparent and has a refractive index slightly higher than a refractive index of a lens of the lens group and is slightly lower than a refractive index of the LED chip.

16. The LED module of claim 15, further comprising:
a lens group; and
a heat sink,
wherein the aluminum substrate is attached to the radiation base and the lens group covers the heat sink, and
wherein a space formed between the lens group and heat sink is filled with encapsulant with refractive index of 1.4~3.

\* \* \* \* \*